US008145454B2

(12) United States Patent
Speldrich (10) Patent No.: US 8,145,454 B2
(45) Date of Patent: Mar. 27, 2012

(54) METHOD AND APPARATUS FOR IMPROVING FATIGUE LIFE OF A WOBBLEFRAM

(75) Inventor: Brian Speldrich, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 879 days.

(21) Appl. No.: 12/107,328

(22) Filed: Apr. 22, 2008

(65) Prior Publication Data

US 2009/0265144 A1      Oct. 22, 2009

(51) Int. Cl.
*G06F 7/60* (2006.01)
*G06G 7/48* (2006.01)
(52) U.S. Cl. .............................. 703/2; 703/6
(58) Field of Classification Search .............. 703/2, 6
See application file for complete search history.

(56) References Cited

U.S. PATENT DOCUMENTS

| 4,250,369 | A |   | 2/1981 | Larkin et al. ............... | 200/339 |
| 4,352,965 | A |   | 10/1982 | Sorenson .................. | 200/6 R |
| 6,713,696 | B1 |   | 3/2004 | Skarlupka et al. ........... | 200/302.3 |
| 6,720,852 | B2 |   | 4/2004 | Farrey et al. ................ | 335/207 |
| 6,847,000 | B1 |   | 1/2005 | Marchini et al. ............ | 200/402 |
| 8,049,193 | B1 | * | 11/2011 | Appleby et al. ............. | 250/505.1 |

OTHER PUBLICATIONS

Yafan Zhang and Kensall D. Wise, Performance of Non-Planar Silicon Diaphragms under Large Deflections, Jun. 1994, Journal of Microelectromechanical Systems, vol. 3, Issue 2, pp. 59-68.*

Yafan Zhang and Kensall D. Wise, Performance of Non-Planar Silicon Diaphragms under Large Deflections, Feb. 1993, IEEE Micro Electromechanical Systems Workshop, Fort Lauderdale, FL, pp. 284-288.*

"Introduction to Pressure Switches", Jul. 24, 2003, downloaded from neodyn.com/download/pdf/industrial/Intro_Pressure_switches.pdf, pp. 1-12.*

* cited by examiner

*Primary Examiner* — Paul Rodriguez
*Assistant Examiner* — Juan Ochoa
(74) *Attorney, Agent, or Firm* — Ingrassia Fisher & Lorenz, P.C.

(57) ABSTRACT

A method and apparatus for improving the fatigue life of a wobblefram utilized in a micro switch. The flexible circular wobblefram can be formed with a fixed edge and a solid center region utilizing a punch and die at elevated temperatures. An external lever can be attached to the solid center region of the wobblefram. The lever can be loaded and actuated to transmit motion from outside of the micro switch to a sealed internal mechanism in order to perform a switching function. Circular and/or sinusoidal shaped corrugations can then be added to the wobblefram and evaluated for performance utilizing a finite element analysis (FEA) model. The FEA model can precisely evaluate and optimize profile, number and height of the circular and/or sinusoidal corrugations. Such a wobblefram with circular and/or sinusoidal corrugations can achieve higher lifetime without affecting the operating characteristics of the micro switch.

9 Claims, 12 Drawing Sheets
(3 of 12 Drawing Sheet(s) Filed in Color)

METHOD AND APPARATUS FOR IMPROVING FATIGUE LIFE OF A WOBBLEFRAM

TECHNICAL FIELD

Embodiments are generally related to diaphragm-actuated pressure sensors and pressure switches. Embodiments are also related to a wobblefram utilized in the context of micro switches. Embodiments are additionally related to methods for improving the fatigue life of a wobblefram.

BACKGROUND OF THE INVENTION

Pressure sensors and switches may utilize different forms of diaphragms for their sensing operations. The diaphragms are often configured in flat-bed shape, wobble-shape and plate-like shape. Such diaphragms can be arranged in micro switches or pressure sensors. Currently, wobblefram designed diaphragms are generally utilized in micro switch devices due to their high operating performances. A wobblefram is essentially a flexible circular diaphragm with a fixed edge and a solid center region, to which a lever can be attached. The lever in the solid center region can be utilized to actuate the internal switching mechanism of the micro switches. The wobblefram also acts as a seal to allow free movement of the micro switch through, for example, a 30 degree angle stroke.

Moreover, a wobblefram can be formed from a relatively flat face by a punch and die at certain elevated temperatures. The basic micro switches utilize a wobblefram element to maintain a hermetic seal and transmit a plunger rotation from outside to a sealed internal mechanism. In particular, the lever in the solid center region is loaded and actuated to transmit motion from outside of the micro switch to the sealed internal mechanism in order to perform the switching function. In a normal process of actuation, the lever and the solid center region can wobble back and forth; hence such a device is referred to as a "wobblefram".

In the majority of prior art micro switches, a major concern is that normal switching actuation leads to fatigue cracking of the wobblefram below the stated specification of 50,000 cycles (e.g., typically between 25,000 and 50,000 cycles). Some prior art wobblefram designs improve the lifetime up to 100,000 cycles. Such a design, however, affect the operating characteristics of the micro switches due to its flat face. In addition, an accurate model for capturing uncontrolled dimensional variations is difficult to construct, because the operators on the factory floor bend and adjust internal and external mechanisms to obtain the correct switching performance characteristics. Therefore, it is desirable to explore new techniques for improving the fatigue life of a wobblefram, about a factor of 6×, (i.e. at least up to nearly 200,000 cycles), without affecting the operating characteristics of the micro switches.

A need therefore exists for methods for improving fatigue life of a wobblefram, which achieves a drop-in replacement for the original design in the context of micro switch applications. Such an improved method is described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide a wobblefram utilized in micro switches.

It is another aspect of the present invention to provide for a method for improving fatigue life of a wobblefram.

The aforementioned aspects and other objectives and advantages can now be achieved as described herein. A method and apparatus for improving the fatigue life of a wobblefram utilized in a micro switch is disclosed. The flexible circular wobblefram can be formed with a fixed edge and a solid center region by a punch and die at elevated temperatures. An external lever can be brazed to the solid center region of the wobblefram. The lever can be loaded and actuated to transmit motion from outside of the micro switch to a sealed internal mechanism in order to perform a switching function. Circular and/or sinusoidal corrugations can then be evaluated on the wobblefram utilizing a finite element analysis (FEA) model. The FEA model can precisely evaluate and optimize profile, number and height of the circular and/or sinusoidal corrugations. Such wobblefram with the circular and/or sinusoidal corrugations can achieve higher lifetime without affecting operating characteristics of the micro switch.

Furthermore, the flexible wobblefram can be modeled with 2-D (two-dimensional) mid-side node shell elements, whose thickness can be set at 0.002 inches. The shell elements include a radial profile, which is built and swept around a center axis to create a 3-D (three-dimensional) surface. The internal mechanism can be energized with a spring in order to move an external lever away from a wobblefram cover. Then the lever can be depressed down towards the cover to make a switching stroke, where the spring tends to push back on a pin and causes a slight negative rotation.

The FEA model analyzes that the lifetime of the wobblefram can be extended by adding three sinusoidal profile corrugations to the wobblefram, while maintaining identical rotational stiffness of the wobblefram. The lifetime of the wobblefram can be increased significantly even further to higher cycles by slightly decreasing the rotational stiffness of the wobblefram, which will not affect the internal workings of the micro switch. The sensitive performance of the wobblefram can be optimized based on its rotational stiffness and the height of the circular and/or sinusoidal corrugations in accordance with the FEA model.

BRIEF DESCRIPTION OF THE DRAWINGS

The file of this patent application contains at least one drawing executed in color. Copies of this patent with color drawing(s) will be provided by the Patent and Trademark Office upon request and payment of the necessary fee. The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
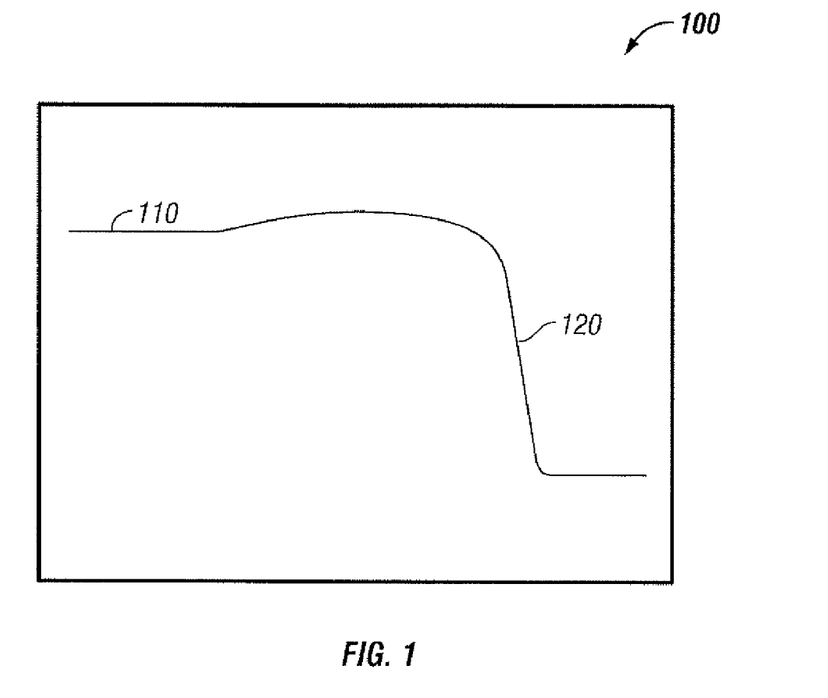
FIG. 1 illustrates a centerline profile of a wobblefram, which can be adapted for use in implementing a preferred embodiment.

Referring to FIG. 1, a centerline profile of a wobblefram 100 is illustrated, which can be adapted for use in implementing a preferred embodiment. The wobblefram 100 can be utilized in a line of micro switches (not shown) in order to maintain a hermetic seal and transmit motion from the outside to a sealed internal mechanism (not shown). The wobblefram 100 can be essentially a circular diaphragm with a fixed outer edge 120 and a solid center region 110, to which an external lever (not shown) can be attached. The external lever brazed to the wobblefram 100 can be loaded and transmits the motion from outside of the micro switch to the internal mechanism to perform the switching function.

In the normal process of actuation, the solid center region 110 can wobble back and forth; hence the term "wobblefram" 100. A finite element analysis (FEA) model (not shown) can be utilized to predict and improve a fatigue lifetime of the wobblefram 100 to above 500,000 cycles by evaluating the causes of the fatigue failure in the wobblefram 100. Assuming that the wobblefram stresses can be isolated to only the wobblefram 100 the rest of the micro switch can be simply replicated with boundary conditions. Such an approach achieves an excellent simplification on the wobblefram 100 with no apparent loss of accuracy and without modeling the entire micro switch.

Figure 2:
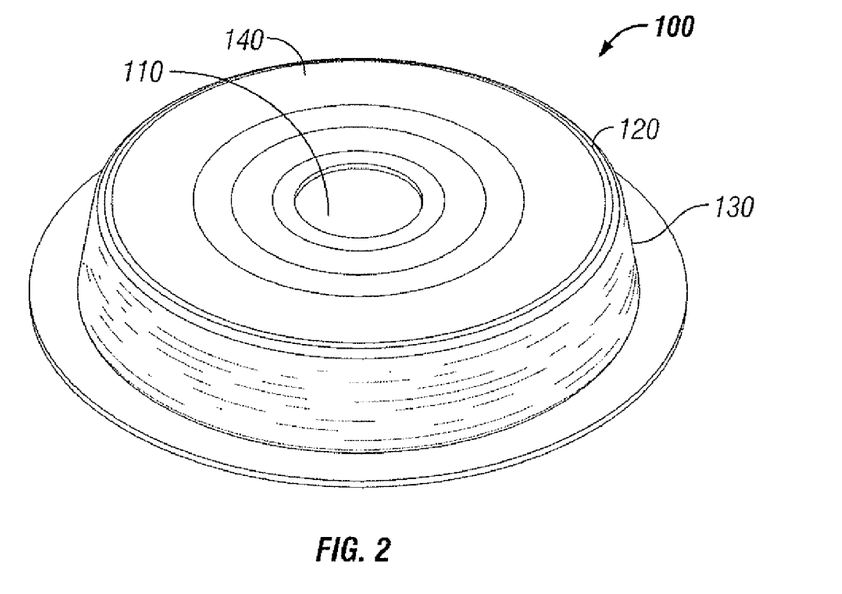
FIG. 2 illustrates an isometric view of the wobblefram, which can be adapted for use in implementing a preferred embodiment.

Referring to FIG. 2, an isometric view of the wobblefram 100 is illustrated, which can be adapted for use in implementing a preferred embodiment. The wobblefram 100 can be modeled with shell elements 130. A radial profile of the wobblefram 100 can be built and swept around a center axis to create a 3-D surface. The thickness of the shell element 130 can be set to, for example, 0.002 inch. The sealed internal mechanism can be energized with a spring (not shown) to move the external lever slightly away from a wobblefram cover 140. The spring tends to push back on a pin (not shown) and causes a slight negative rotation. Then the external lever can be depressed down towards the cover 140 to make a switching stroke. The tip of the lever is offset from the centerline, so the applied displacement therefore results in a rotation of the wobblefram center.

In order to analyze the wobblefram 100, a pin angle can be calculated, based on the internal mechanism by utilizing a spreadsheet, from a clearance between the external lever and the cover 140 and a length (e.g., 0.320 inch) of the lever. Such an approach allows for an accurate measurement of the nominal value of the initial position and additional data, such parameters that can be utilized as inputs to load a model of the wobblefram 100. Then final position values can be determined based on an initial pre-stress clearance position of, for example, nominally −0.0053 inch and a final clearance position of, for example, nominally 0.009 inch yielding a total travel of 0.0143 inch. The final position values can be utilized to calculate a center pin rotation angle, which is then applied to the brazed inner surface (not shown) of the wobblefram 100, from the center region 110 of the wobblefram 100 at, for example, r=0.021 inch out to the pin's outer diameter at r=0.050 inch. Such a boundary condition can apply the rotational deflection to the inner surface of the wobblefram 100. Then the outer edge 120 of the wobblefram 100 can be fixed at zero movement to supply the boundary conditions.

Figure 3:
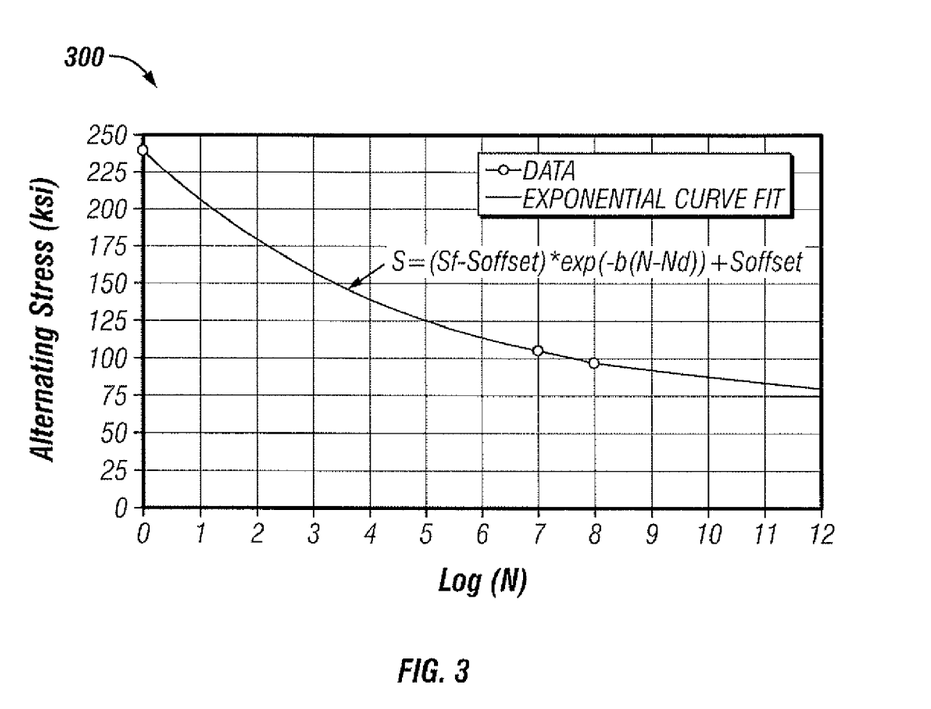
FIG. 3 illustrates a S-N curve of material properties of the wobblefram, in accordance with a preferred embodiment.

Referring to FIG. 3, an S-N curve 300 of material properties of the wobblefram 100 is illustrated, in accordance with a preferred embodiment. In the example depicted in FIG. 3, the wobblefram material with full material non-linearity can be, for example, 15-5PH or 15-7PH SST, where the Young's Modulus is approximately 29 mega pounds per square inch (Mpsi), i.e. 200 gigapascals (GPa). Similarly, yield stress can be, for example, 225 kilo pounds per square inch (ksi), (i.e. 1551 mega-pascals (MPa)), and the ultimate tensile strength ($\sigma_{UT}$) can be 240 ksi, (i.e. 1655 MPa), with an elongation of, for example, 6%. In addition, the fatigue strengths ($S_f$) for the wobblefram material can be, for example, 44% $\sigma_{UT}$ at 1e7 cycles and 41% at 1e8 cycles.

These material specifications are described for purposes of clarity and specificity; however, they should not be interpreted as limiting features of the disclosed invention. Other specifications and parameters are possible. It will be apparent, however, to those skilled in the art that such specifications and parameters can be altered without departing from the scope of the invention. The signal-to-noise (S-N) curve 300, for example, can be created for fatigue calculation along with a Gerber mean-stress correction to calculate the fatigue life of the wobblefram 100 by utilizing the material properties of the wobblefram 100. Finite element modeling procedures can then be utilized to calculate the fatigue life for every element which assist in plotting data indicative of the fatigue life as a contour plot for the entire wobblefram 100 so that the spot with the lowest fatigue life can be clearly identified.

Figure 4:
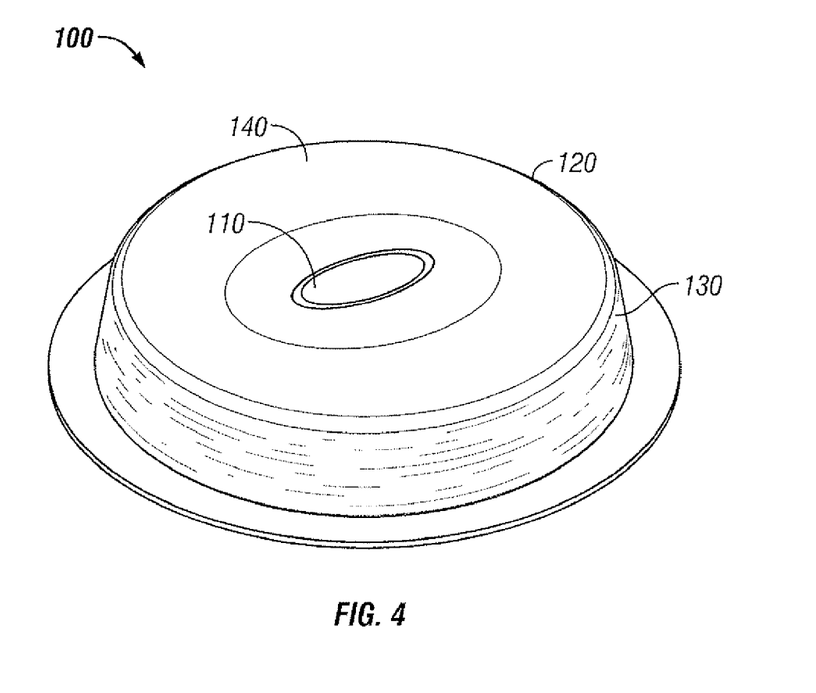
FIG. 4 illustrates a schematic view of the wobblefram with a plot of Von Mises stress for an initial position due to rotation induced by an internal mechanism, in accordance with a preferred embodiment.
Figure 5:
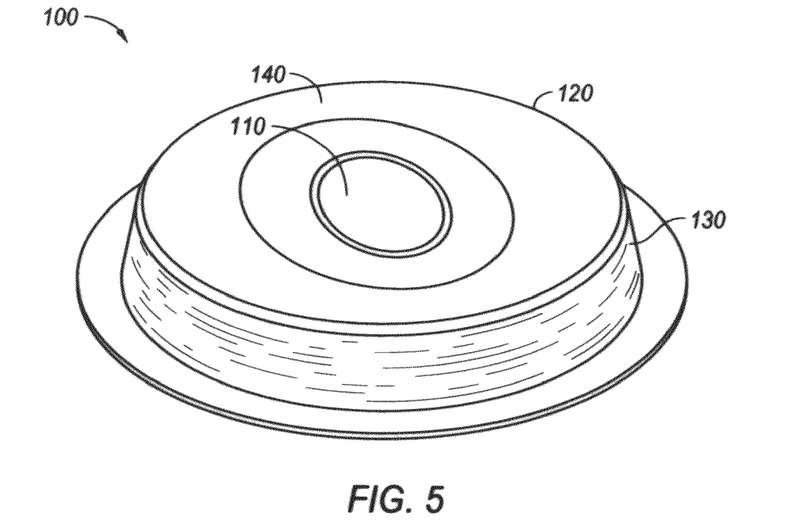
FIG. 5 illustrates a schematic view of the wobblefram with a plot of Von Mises stress for a final position due to rotation induced by an internal mechanism, in accordance with a preferred embodiment.

Referring to FIGS. 4-5, schematic views of the wobblefram 100 with a plot of Von Mises stress data for initial and final positions due to rotation induced by an internal mechanism (deflection exaggerated) is illustrated, in accordance with a preferred embodiment. Note that in FIGS. 1-19 identical parts or elements are generally indicated by identical reference numerals. FIGS. 4-5 demonstrate the Von Mises stress for the initial and final positions, respectively, which exaggerate deflection from 8× to 10× in accordance with the rotation induced by the internal mechanism of the wobblefram 100. The results can be utilized for fatigue life calculation routine to determine a fatigue lifetime. Both the upper and lower surfaces can be searched and a minimum value for the whole body can be utilized as the lifetime of the wobblefram 100.

Figure 6:
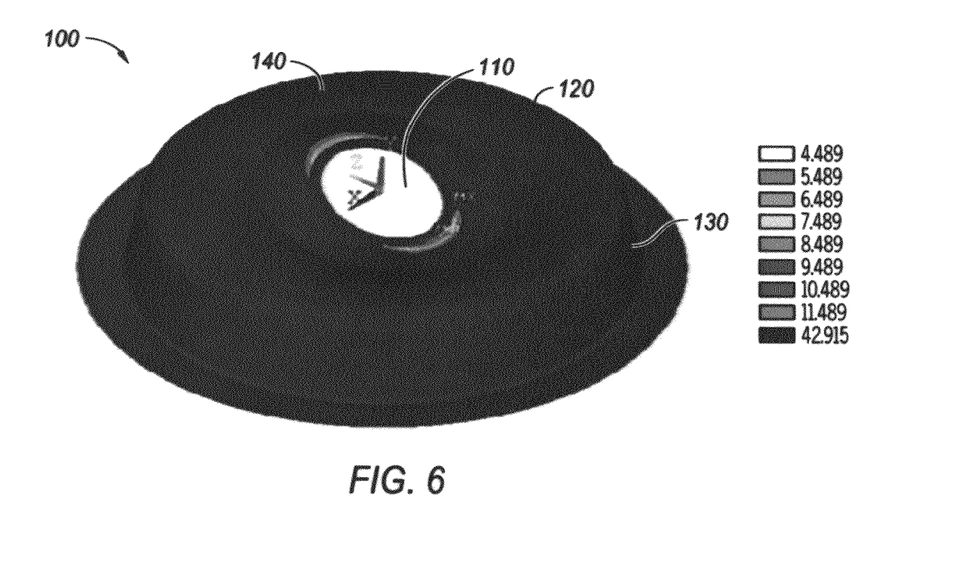
FIG. 6 illustrates a plot of a fatigue lifetime of the wobblefram, in accordance with a preferred embodiment.

Referring to FIG. 6, a plot of data indicative of a fatigue lifetime of the wobblefram 100 is illustrated, in accordance with a preferred embodiment. Note that the scale of the fatigue life can be provided in log (lifetime) values. For example, consider a case which includes a value 6 that represents a lifetime of $10^6$ or 1 million cycles. In such a situation, the weakest point on the bottom surface of the wobblefram 100 can be actually located at the outer diameter of an inner braze joint (not shown). Normally, the fatigue life for the original design with nominal loading conditions can be, for example, 30,808 cycles. During testing of actual parts, the standard product usually fails (i.e., loses hermeticity) around 50,000 cycles and a crack may begin to form at the outer diameter of the braze joint, moving circumferentially around until the pin is detached from the wobblefram 100. Thus the model appears to match actual test data very well and should be an excellent vehicle to optimize the wobblefram 100 for improving the fatigue life to approximately 500,000 cycles.

Figure 7:
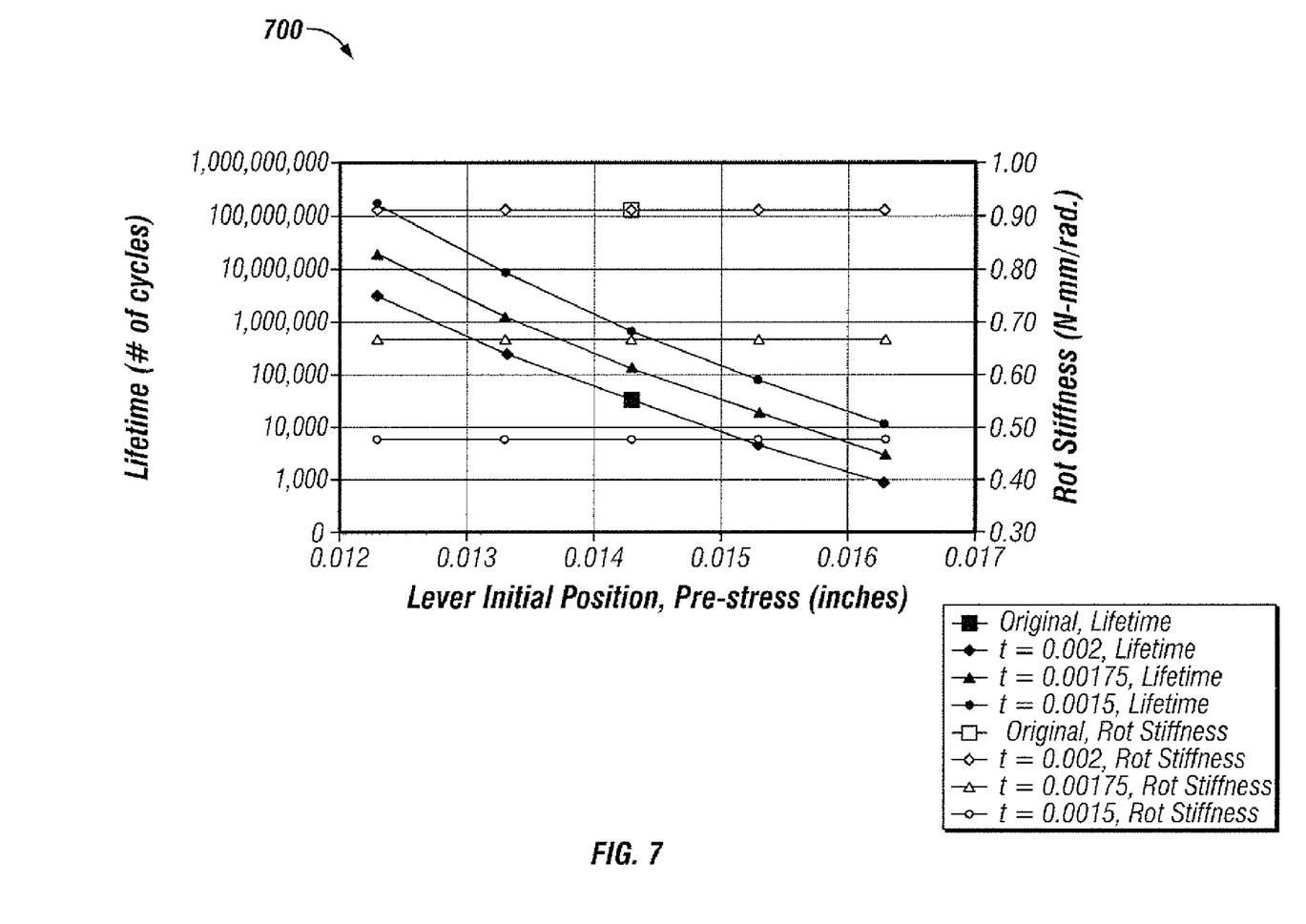
FIG. 7 illustrates a graph of a fatigue lifetime, a rotational stiffness versus a lever initial position of the wobblefram, in accordance with a preferred embodiment.

Referring to FIG. 7, a graph 700 of a fatigue lifetime, a rotational stiffness versus a lever initial position of the wobblefram 100 is illustrated, in accordance with a preferred embodiment. The design model of the wobblefram 100 can be optimized by means of thinner stock and variations in pre-travel and total travel, circular profile corrugations and sinusoidal profile corrugations. In the process of evaluating various designs in the search for an improved lifetime, the stress levels and the rotational stiffness of the wobblefram 100 due to the pin can be considered. If the rotational stiffness is less, then the pin can be pushed back by the internal mechanism, which affects operating characteristics of the micro switch. Thus, the rotational stiffness can be monitored for all designs, with the goal of finding the maximum lifetime while keeping the rotational stiffness as constant as possible.

In addition, stock thickness, pre-travel and total travel can affect the fatigue life of the wobblefram 100. The amount of pre-travel affected performance and stress levels can be varied when total travel kept constant at 0.0143 inch. Mean stress is zero and lifetime is longest, when the pre-travel is 0.00715 inch, (i.e. half of the total travel). The removal of pre-travel can significantly decrease the lifetime due to quick rise in the peak stress. In fact, the stress can be reached right to the yield point at zero pre-travel. Thereafter, the total travel can be varied from 0.0123 inch up to 0.0163 inch in 0.001 inch steps for three stock thicknesses, for example, such as 0.002 inch, 0.00175 inch, and 0.0015 inch. The graph 700 illustrates the variation of the fatigue life and the rotational stiffness of the wobblefram 100 with these parameters, along with the original design's performance.

The fatigue life can be a very strong function of total travel and stock thickness. For the standard 0.002 inch thickness stock, the fatigue life can vary from 820 cycles at a total travel of 0.0163 inch up to 3 million cycles for 0.0123 inch total travel. Every step down of 0.00025 inch in thickness increases the lifetime by a factor of approximately 4×. The curves are basically flat lines, such that the rotational stiffness is independent of the amount of travel due to the stock thickness, as illustrated in the graph 700. A thinner stock can improve the lifetime, but it changes the rotational stiffness and affects the switch performance. Therefore, corrugations can be introduced, which add more in-plane flexibility, to reduce the stress for improving the lifetime of the wobblefram 100.

Figure 8:
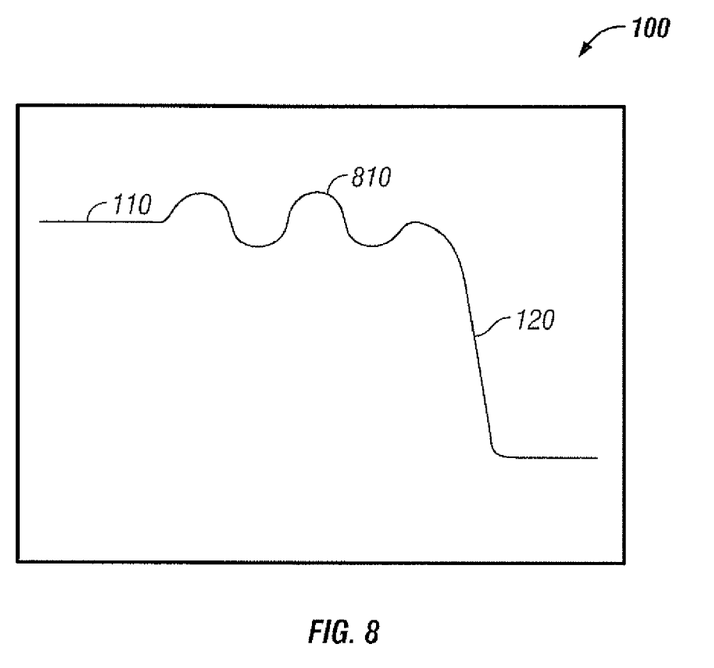
FIG. 8 illustrates a centerline profile of the wobblefram with a circular corrugation, in accordance with a preferred embodiment.

Referring to FIG. 8, a centerline profile of the wobblefram 100 with a circular corrugation 810 is illustrated, in accordance with a preferred embodiment. The wobblefram 100 can be formed with the circular corrugation 810 by a punch and die at elevated temperatures. The circular profile, number and height of the corrugation 810 can be carefully evaluated by the FEA model (not shown). These circular corrugations 810 can be added between the solid center region 110 and the fixed edge 120 of the wobblefram 100. The corrugations serve to reduce in-plane stiffness, which lowers the stress in the critical fatigue zone, while maintaining the same rotational stiffness so that the internal switching mechanism is unaffected. Such a corrugation 810 can be utilized in pressure sensors to form media isolation diaphragms. The corrugation 810 can be designed to transmit pressure in a more linear fashion during the stroke than the flat diaphragms. Note that in FIGS. 1-19 identical parts or elements are generally indicated by identical reference numerals.

Figure 9:
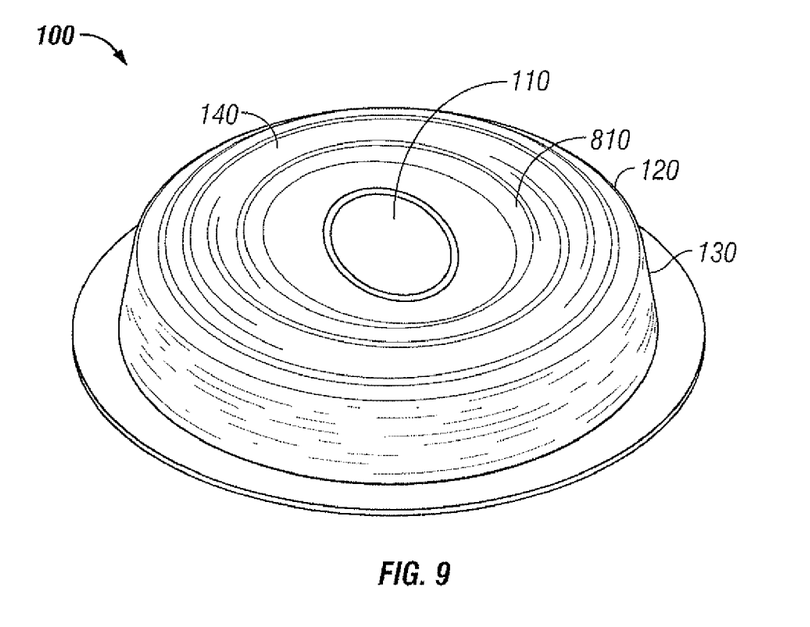
FIG. 9 illustrates an isometric view of the wobblefram with the circular corrugation and a plot of Von Mises stress for nominal loading conditions, in accordance with a preferred embodiment.
Figure 10:
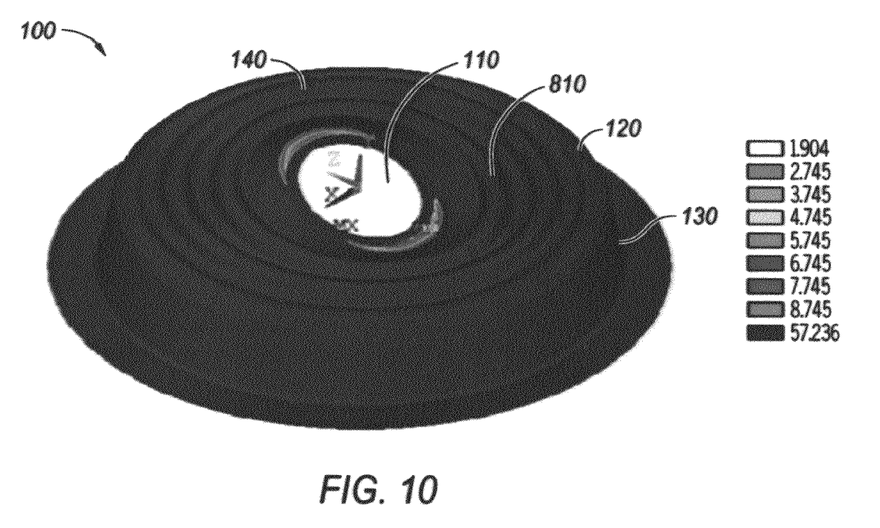
FIG. 10 illustrates a plot of a fatigue lifetime of the wobblefram with the circular corrugation, in accordance with a preferred embodiment.

For example, the corrugation profile can be circular, so that the amplitude or height (h) is equal to the radius (r) of the circular profile, and the period is equal to 4*r. The number of corrugations 810 can vary between 0.5, 1.0, 1.5, and 2. Note that the radius of curvature-to-thickness ratio is less than 2.0. FIG. 9 clearly illustrates the plot of the Von Mises stress for the nominal loading conditions of the wobblefram 100 with 2 full circular corrugations 810. The fatigue lifetime of the wobblefram 100 can be slightly improved to 56,000 cycles by utilizing the circular corrugations 810, as illustrated in FIG. 10, but the rotational stiffness is increased to 1.629 inches as compared with the original design.

Figure 11:
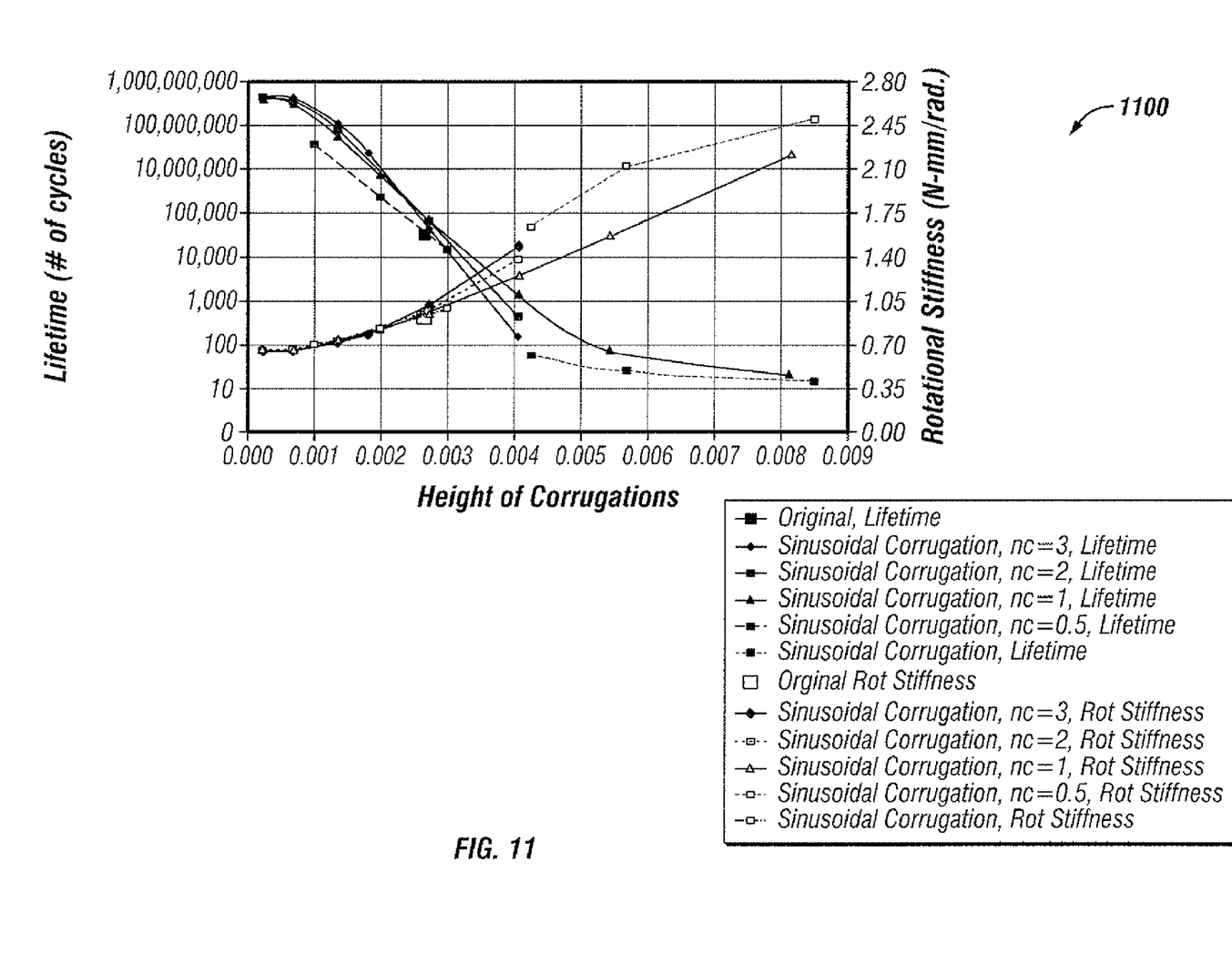
FIG. 11 illustrates a graph of a fatigue lifetime, a rotational stiffness versus a corrugation height of the wobblefram with both circular and sinusoidal corrugations, in accordance with an alternative embodiment.
Figure 15:
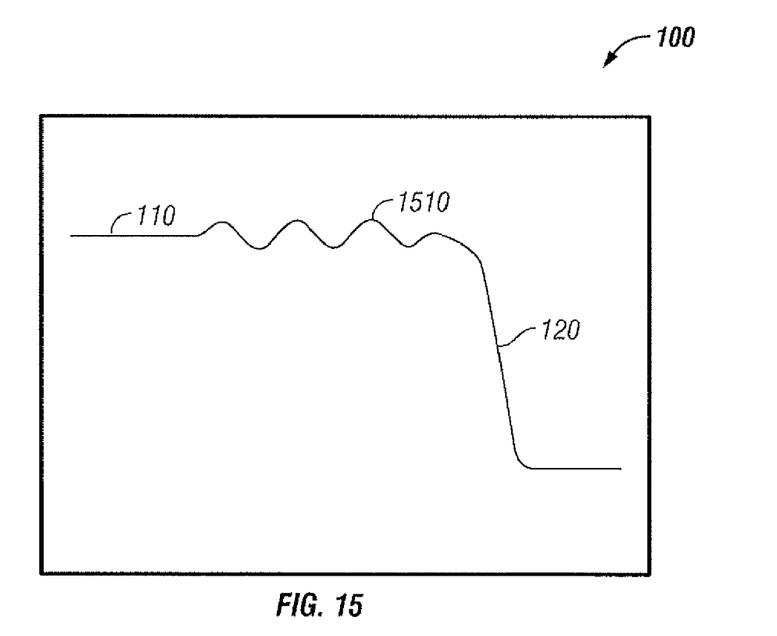
FIG. 15 illustrates a centerline profile of the wobblefram with a sinusoidal corrugations, in accordance with an alternative embodiment.

Referring to FIG. 11, a graph 1100 of a fatigue lifetime, a rotational stiffness versus a corrugation height of the wobblefram 100 with both circular and sinusoidal corrugations 810 and 1510 is illustrated, in accordance with an alternative embodiment. The sinusoidal corrugation 1510, as illustrated in FIG. 15, can be added between the solid center region 110 and the fixed edge 120 of the wobblefram 100 by means of a punch and die at elevated temperatures. The sinusoidal profile, number and height of the corrugation 1510 can be carefully evaluated by the FEA model (not shown). The sinusoidal profile corrugations 1510 can basically allow any combination of corrugations and height (h). Interestingly, in the process of performing this analysis, a special case of the sinusoidal profile corrugation 1510 occurs when the number of corrugations (nc) is set to 0.5 (one raised, half lobe) and the corrugation height (h) is set to the appropriate value, you get a design very similar to the current design. Using the FE model to evaluate this, you get a lifetime of 35,251 cycles and a rotational stiffness of 0.916 N-mm/radian, which is essentially the same as the FE Model of the original part which has baseline values of 30,808 cycles and 0.910 N-mm/rad.

From here, though, the design can be improved by adding more corrugations. For example, the fatigue lifetime of the wobblefram 100 with the sinusoidal corrugations 1510 can be increased to 57560 cycles, if the number of corrugations (nc)=2 and the height h=0.00272 inch. The height h can be 0.003 inch, but it is actually 0.0026613 inch, since the outer edge 120 of the corrugations 1510 is 0.0006 inch above the inner planar surface of the wobblefram 100 at a radius of 0.0782 inch. Thus, the sinusoidal corrugations 1510 can climb "uphill" slightly when moving out from the center region 110 to the outer edge 120 of the wobblefram 100. The graph 1100 depicts all of the results, with fatigue lifetime and rotational stiffness plotted as a function of corrugation height, as illustrated in FIG. 11. From the data depicted in graph 1100, it can be appreciated that the standard rotational stiffness can be achieved when the corrugation height is set to, for example, a 0.0025 inch range.

In addition, the fatigue lifetime can be directly compared with a function of the rotational stiffness of the wobblefram 100, which shows through observations that the lifetime can be improved by adding the sinusoidal corrugations 1510 without losing the rotational stiffness. The sinusoidal corrugations 1510 can add in-plane flexibility and reduce the stress concentration at the outer edge 120 of the wobblefram 100. The optimum lifetime, (e.g., 125,661 cycles), can be achieved when nc=2 and h=0.0025 inch, for example, based on the observations utilizing a series of 0.5, 1.0, 1.5, 2.0, 2.5, and 3 sinusoidal profiled corrugations 1510 with a constant height h=0.0025 inch, as illustrated in graph 1200 in FIG. 12.

Figure 12:
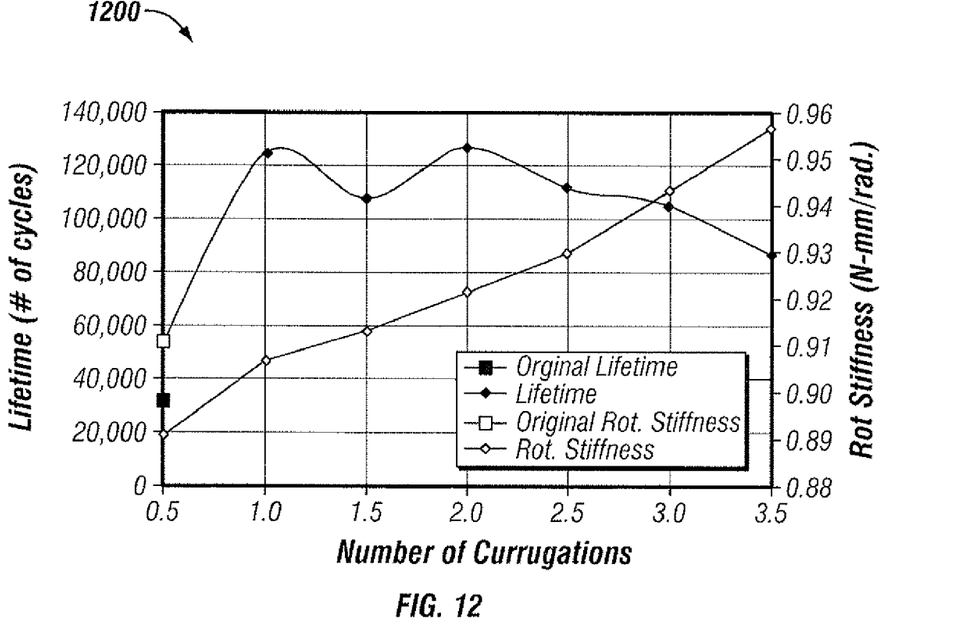
FIG. 12 illustrates a graph of a fatigue lifetime, a rotational stiffness versus a number of corrugation of the wobblefram for a 0.0025 inch sinusoidal corrugation height, in accordance with an alternative embodiment.
Figure 13:
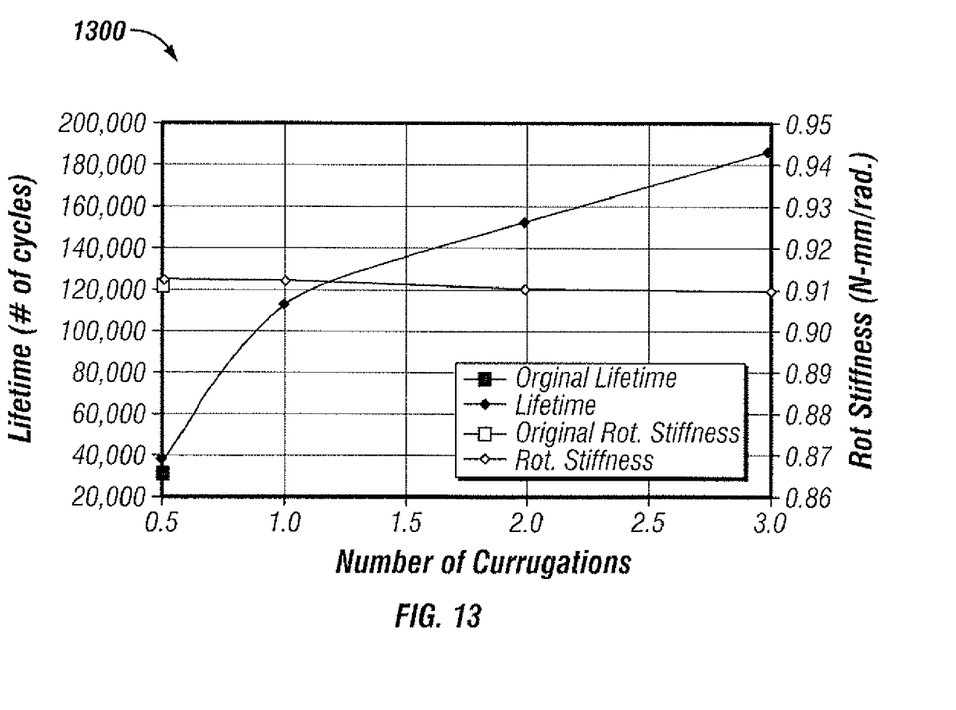
FIG. 13 illustrates a graph of a fatigue lifetime versus a number of corrugation of the wobblefram for a 0.9101 rotational stiffness, in accordance with an alternative embodiment.
Figure 14:
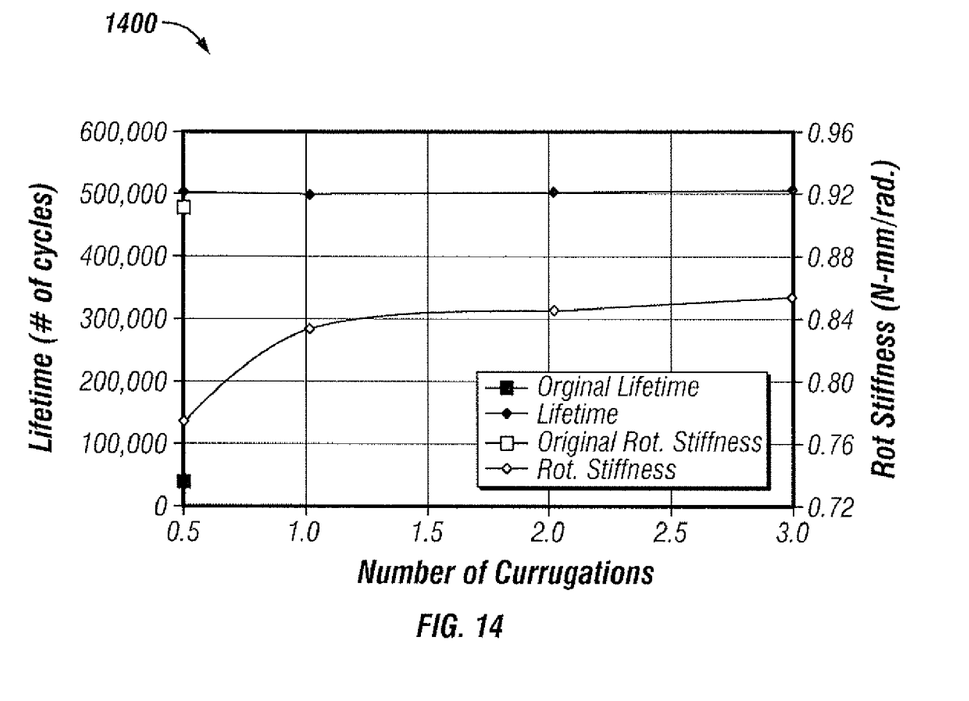
FIG. 14 illustrates a graph of a fatigue lifetime, a rotational stiffness versus a number of corrugation of the wobblefram for 500,000 cycles, in accordance with an alternative embodiment.

In FIG. 13, a more careful FEA was performed in an attempt to evaluate lifetime for a more constant value of rotational stiffness (0.9101) than that found in FIG. 12, in accordance with an alternative embodiment. The FEA model evaluates that the lifetime can be increased more while doing a study with more precisely controlled rotational stiffness. According to the data depicted in graph 1300, the optimum lifetime can be shifted, for example, to nc=3 with the constant rotational stiffness=0.9101 such that the optimum can be three sinusoidal corrugations 1510 instead of two. The decrease in stiffness occurs in relation to the reduction in height h. With this optimum design, the lifetime can be increased, for example, from 30,808 cycles up to 185,545 cycles for h=0.00237215 inch. Accordingly, the rotational stiffness is basically identical to the original design. A graph 1400 depicts that, for example, the 500,000 cycle lifetimes of the wobblefram 100 can be achieved at nc=0.5, 1, 2 and 3 with the rotational stiffness=0.92, as illustrated in FIG. 14.

Figure 16:
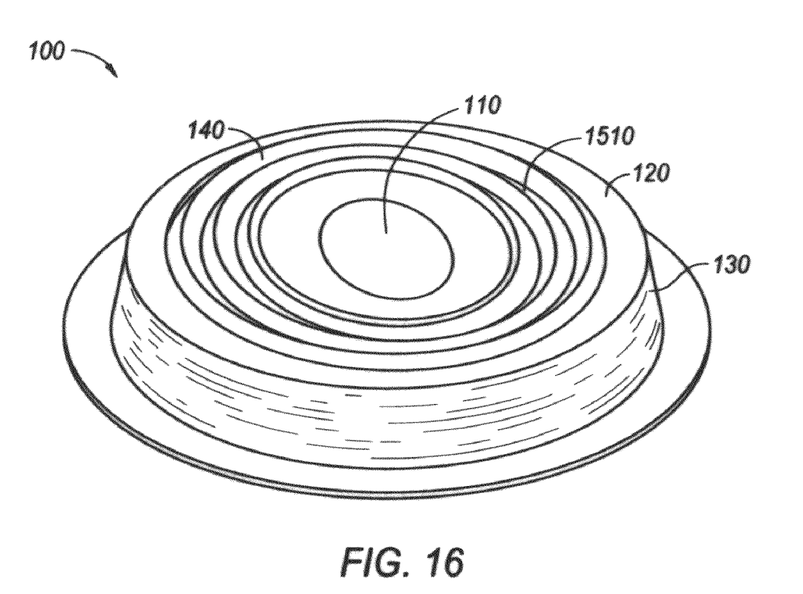
FIG. 16 illustrates an isometric view of the wobblefram with the sinusoidal corrugations and a plot of Von Mises stress for nominal loading conditions, in accordance with an alternative embodiment.

Referring to FIG. 15, a centerline profile of the wobblefram 100 with sinusoidal corrugations 1510 is illustrated, in accordance with an alternative embodiment. An optimum lifetime of 500,000 cycles, for example, can be identified in three sinusoidal profile corrugations 1510 with a height-to-period ratio of, for example, 0.208, (i.e. h=0.00214286 inch), as illustrated in the graph 1400. At this point, the rotational stiffness can be, for example, 0.854, which is slightly smaller than the original design's stiffness of, for example, 0.9101. Such a rotational stiffness can be an acceptable drop-in replacement with Von Mises stress for nominal loading conditions at full travel, as illustrated in FIG. 16. Note that in FIGS. 1-19, identical parts or elements are generally indicated by identical reference numerals.

Figure 17:
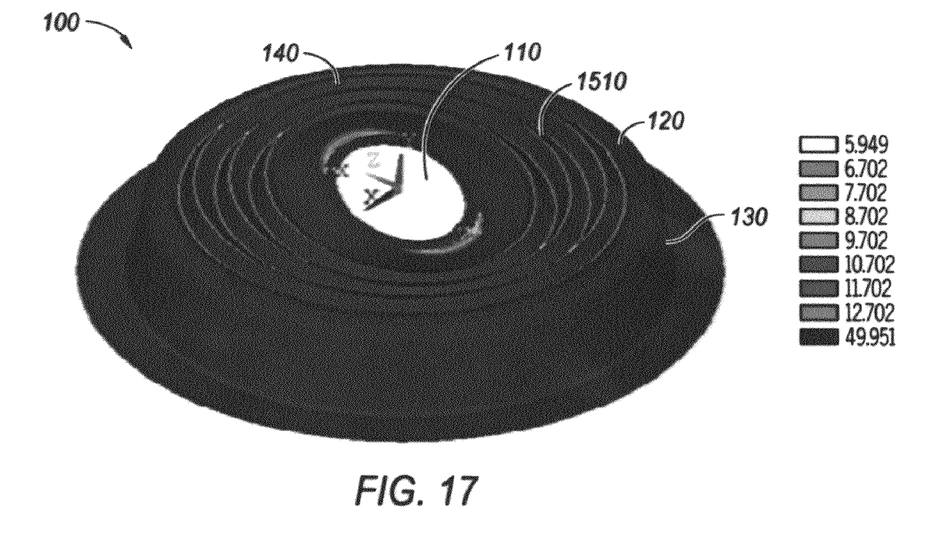
FIG. 17 illustrates a plot of a fatigue lifetime of the wobblefram with the sinusoidal corrugations, in accordance with an alternative embodiment.
Figure 18:
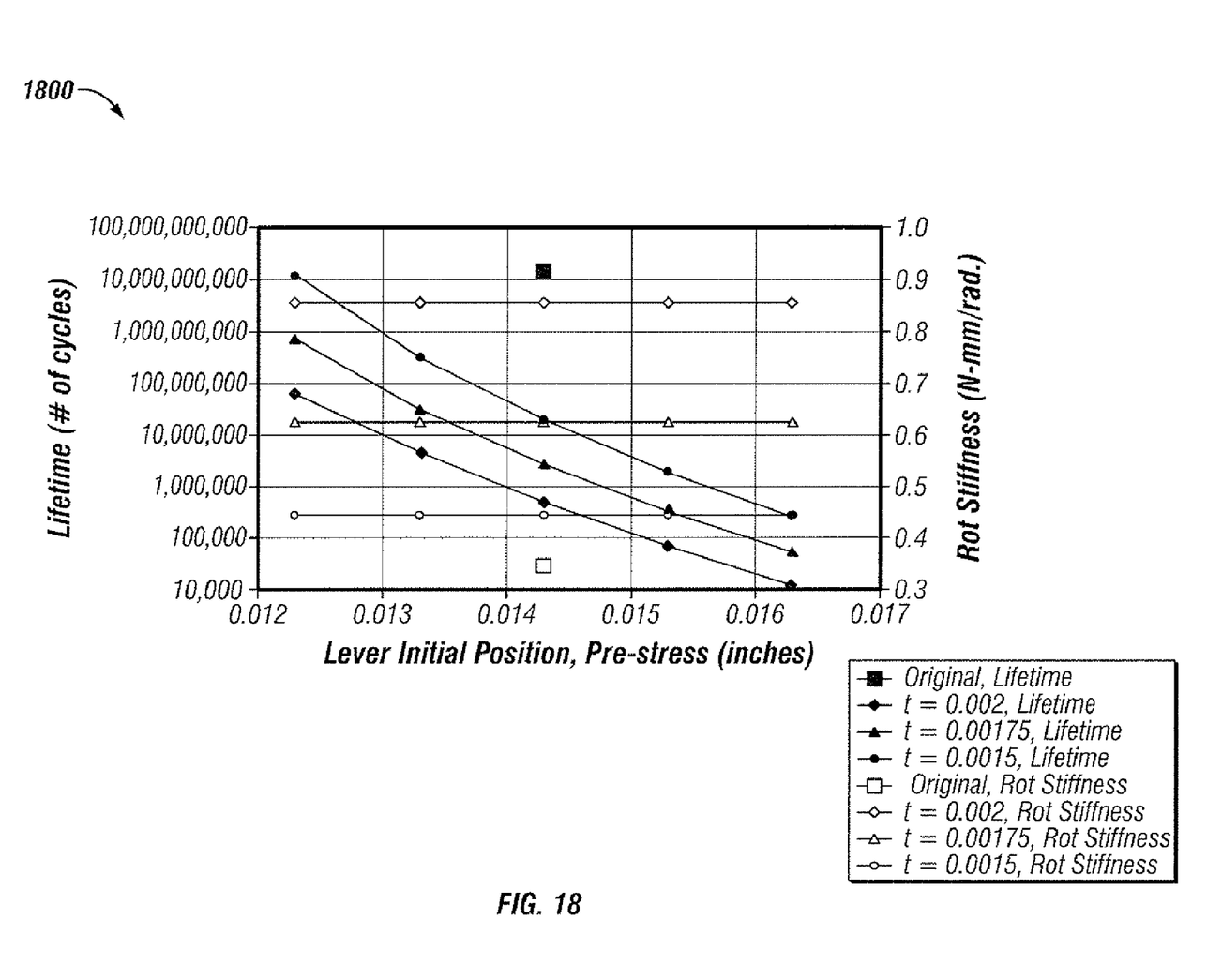
FIG. 18 illustrates a graph of a fatigue lifetime, a rotational stiffness versus a lever initial position of the wobblefram with the sinusoidal corrugations, in accordance with an alternative embodiment.

Referring to FIG. 17, a plot of a fatigue lifetime of the wobblefram 100 with the sinusoidal corrugations 1510 is illustrated, in accordance with an alternative embodiment. The fatigue lifetime can be optimized to, for example, 504,068 cycles, when the rotational stiffness is, for example, 0.854, nc=3 and h=0.00214268 inch, as shown in FIG. 17. Utilizing the design (nc=3), a graph 1800 can be plotted with the fatigue lifetime, the rotational stiffness and the lever initial position of the wobblefram 100 with the sinusoidal corrugations 1510 by varying the stock thickness and the total displacement, as illustrated in FIG. 18. The graph 1800 indicates that the lifetime curves are in significantly higher position.

Figure 19:
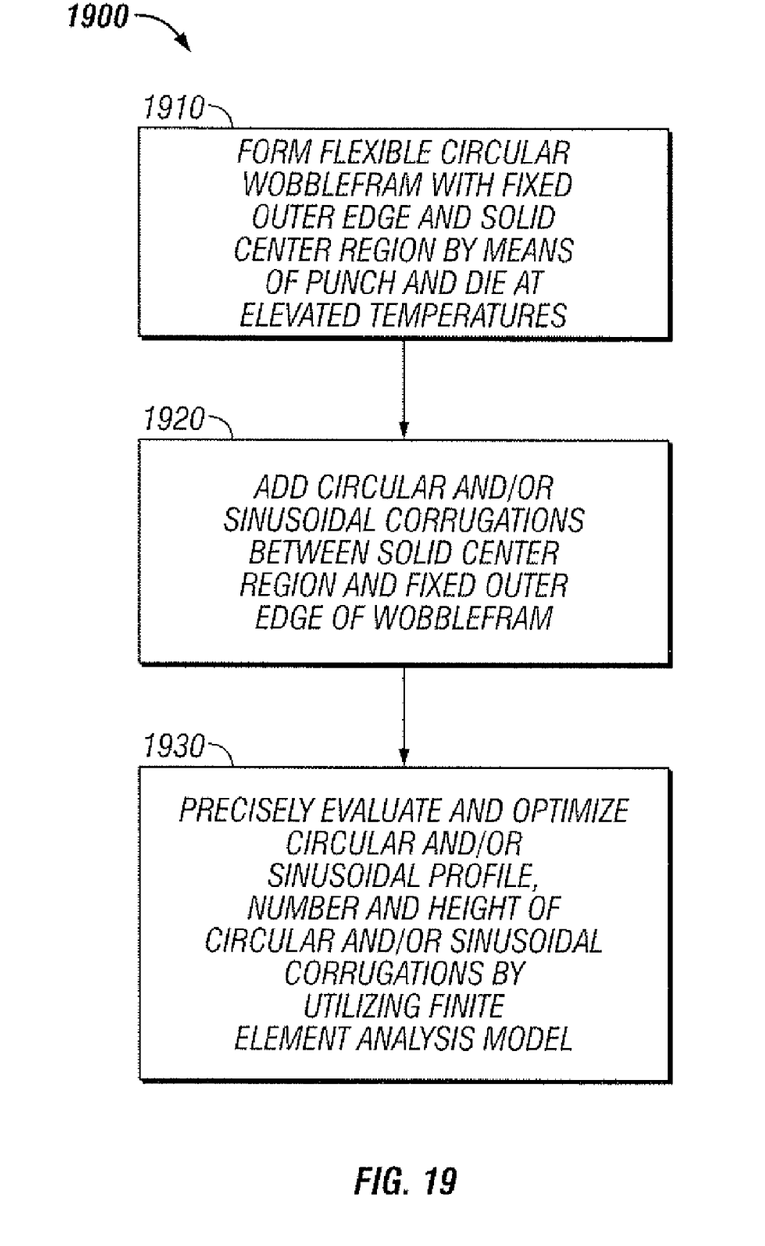
FIG. 19 illustrates a flow chart illustrative of a method for improving fatigue life of the wobblefram, in accordance with a preferred embodiment.

Referring to FIG. 19, a flow chart illustrative of a method 1900 for improving fatigue life of the wobblefram 100 is depicted, in accordance with a preferred embodiment. As illustrated at block 1910, a flexible circular wobblefram 100 can be formed with a fixed outer edge 120 and a solid center region 110 by means of a punch and die at elevated temperatures. In addition, the flexible wobblefram can be modeled utilizing shell elements 130, whose thickness can be set to, for example, 0.002 inches. The solid center region 110 of the wobblefram 100 can be brazed with an external lever (not shown), which can be loaded and actuated to transmit motion from outside of a micro switch (not shown) to a sealed internal mechanism in order to perform a switching function thereof.

Thereafter, as described at block 1920, circular and/or sinusoidal corrugations 810 and 1510 can be added between the solid center region 110 and the fixed outer edge 120 of the wobblefram 100. As depicted at block 1930, a finite element analysis (FEA) model can precisely evaluate and optimize a circular and/or sinusoidal profile, a number and a height or an amplitude of the circular and/or sinusoidal corrugations 810 and 1510 in order to achieve a higher fatigue lifetime with respect to the wobblefram 100 without affecting the operating characteristics of the micro switch. According to the finite element analysis, the sensitive performance of the wobblefram 100 can be optimized based on its rotational stiffness and the height of the circular and/or sinusoidal corrugations 810 and 1510.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for improving the fatigue life of a flexible wobblefram, comprising:
    forming a flexible wobblefram with a fixed outer edge and a solid center region utilizing a punch and a die, wherein said flexible wobblefram is modeled with at least one shell element;
    adding at least one corrugation between said fixed outer edge and said solid center region of said flexible wobblefram, wherein said solid center region is brazed with at least one external lever;
    precisely evaluating and optimizing a profile, a number and a height of said at least one corrugation utilizing a finite element analysis model in order to achieve a higher fatigue lifetime with respect to said flexible wobblefram without affecting one or more operating characteristics of a micro switch thereof; and optimizing said flexible wobblefram with respect to a rotational stiffness of said flexible wobblefram and said height of said at least one corrugation in accordance with said finite element analysis model.

2. The method of claim 1 wherein said at least one corrugation comprises at least one circular-shaped profile corrugation.

3. The method of claim 2 wherein said at least one circular-shaped profile corrugation comprises a full semi-circle.

4. The method of claim 2 wherein said at least one circular-shaped profile corrugation comprises a plurality of circular arc segments.

5. The method of claim 1 wherein said at least one corrugation comprises at least one sinusoidal-shaped profile corrugation.

6. The method of claim 1 further comprising loading and actuating said at least one external lever to transmit motion external from said micro switch to a sealed internal mechanism in order to perform a switching function.

7. The method of claim 1 wherein said flexible wobblefram is utilized in said micro switch.

8. The method of claim 1 wherein said flexible wobblefram comprises a circular diaphragm.

9. The method of claim 6 further comprising energizing said sealed internal mechanism with a spring in order to move said at least one external lever away from a wobblefram cover.

* * * * *